(12) United States Patent
Naito et al.

(10) Patent No.: US 9,877,418 B2
(45) Date of Patent: Jan. 23, 2018

(54) MOTOR DRIVE DEVICE IN WHICH FAN MOTOR IS EXCHANGEABLE AND CONTROL PANEL INCLUDING SAME

(71) Applicant: FANUC CORPORATION, Yamanashi (JP)

(72) Inventors: Genzo Naito, Yamanashi (JP); Kazuhiro Yamamoto, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/189,344

(22) Filed: Jun. 22, 2016

(65) Prior Publication Data
US 2017/0013743 A1 Jan. 12, 2017

(30) Foreign Application Priority Data
Jul. 6, 2015 (JP) .................. 2015-135278

(51) Int. Cl.
*H02K 5/20* (2006.01)
*H01L 23/467* (2006.01)
(Continued)

(52) U.S. Cl.
CPC ....... *H05K 7/20918* (2013.01); *H01L 23/467* (2013.01); *H01L 23/473* (2013.01);
(Continued)

(58) Field of Classification Search
CPC ....... H01L 23/467; H01L 23/473; H02K 5/20; H02K 5/225; H02K 5/18; H02K 9/14;
(Continued)

(56) References Cited

U.S. PATENT DOCUMENTS 4,520,425 A * 5/1985 Ito .................. H02M 7/003
165/80.2
4,742,864 A * 5/1988 Duell ............... H05K 7/20145
165/122
(Continued)

FOREIGN PATENT DOCUMENTS

JP 3404907 B2 5/2003
JP 200927776 A 2/2009
(Continued)

OTHER PUBLICATIONS

English Abstract and Machine Translation for Japanese Publication No. 2009-027776 A, published Feb. 5, 2009, 10 pgs.
(Continued)

*Primary Examiner* — Adam B Dravininkas
(74) *Attorney, Agent, or Firm* — Fredrikson & Byron, P.A.

(57) ABSTRACT

In a motor drive device of the present invention, a motor control unit is disposed on a first surface of an attaching unit, and a heat sink is disposed on a second surface opposite to the first surface. A first duct connects the second surface and the heat sink with each other. A second duct is disposed on the first surface, and a fan motor is disposed in the second duct. A space inside the first duct in communication with only a second opening of the attaching unit, and a space inside the second duct is in communication with both a first opening and the second opening of the attaching unit.

8 Claims, 6 Drawing Sheets

(51) Int. Cl.
*H05K 7/20* (2006.01)
*H01L 23/473* (2006.01)
*H02K 5/22* (2006.01)

(52) U.S. Cl.
CPC .......... *H05K 7/20163* (2013.01); *H02K 5/20* (2013.01); *H02K 5/225* (2013.01)

(58) Field of Classification Search
CPC .. G06F 1/20; H05K 7/20836; H05K 7/20918; H05K 9/0081; H05K 7/20436; H05K 13/00; H05K 7/20409; H05K 1/141; H05K 7/20418; H05K 5/0217; H05K 5/0221; H05K 7/20727; H05K 9/0007; H05K 1/0215; H05K 2201/09081; H05K 2201/10386; H05K 2201/10446; H05K 9/0047; H05K 7/20809; H05K 7/20136; H05K 7/20736; H05K 7/20145; H05K 7/20209; H05K 7/1432; H05K 7/20154; H05K 7/20927; H05K 7/20936
See application file for complete search history.

(56) References Cited

U.S. PATENT DOCUMENTS

| | | | | |
|---|---|---|---|---|
| 6,233,149 | B1* | 5/2001 | Bailey | H02M 7/003 165/104.33 |
| 6,362,594 | B2* | 3/2002 | Kajiura | B60L 11/1825 320/104 |
| 8,687,357 | B2* | 4/2014 | Nagano | H02M 7/08 165/104.33 |
| 2004/0121719 | A1* | 6/2004 | Robison | B60H 1/00478 454/143 |
| 2004/0232787 | A1* | 11/2004 | Kopf | H02K 11/33 310/89 |
| 2009/0310301 | A1* | 12/2009 | Nelson | H05K 7/20163 361/695 |
| 2010/0053898 | A1* | 3/2010 | Isomoto | H05K 7/20918 361/697 |
| 2011/0111838 | A1* | 5/2011 | Bauer | G06F 1/20 463/25 |

FOREIGN PATENT DOCUMENTS

| | | |
|---|---|---|
| JP | 2009284607 A | 12/2009 |
| JP | 2011259556 A | 12/2011 |
| JP | 5312012 B2 | 10/2013 |

OTHER PUBLICATIONS

English Abstract and Machine Translation for Japanese Publication No. 3404907 B2, published May 12, 2003, 26 pgs.
English Abstract and Machine Translation for Japanese Publication No. 5312012 B2, published Oct. 9, 2013, 19 pgs.
English Abstract and Machine Translation for Japanese Publication No. 2011-259556 A published Dec. 22, 2011, 13 pgs.
English Abstract and Machine Translation for Japanese Publication No. 2009-284607 A published Dec. 3, 2009, 16 pgs.

* cited by examiner

MOTOR DRIVE DEVICE IN WHICH FAN MOTOR IS EXCHANGEABLE AND CONTROL PANEL INCLUDING SAME

BACKGROUND OF THE INVENTION

1. Field of the Invention

The present invention relates to a motor drive device that is implemented in a control panel, such, for example, as a heavy electrical control panel of an NC machine tool. In particular, the present invention relates to a motor drive device including a motor control unit, a heat sink attached to the motor control unit, and a fan motor for cooling the heat sink, wherein the fan motor is removably mounted, and a control panel including such a device.

2. Description of the Related Art

In a motor control unit of the motor drive device that is implemented in the control panel, there is mounted a heat sink for heat dissipation. The cooling effect of the heat sink is enhanced by disposing the fan motor adjacent to the heat sink.

Further, in order to prevent hot air from being filled in the control panel, sometimes a hole or notch is formed in a rear wall portion of the control panel, dispose the motor control unit of the motor drive device in the control panel, and let only the heat sink attached to the motor control unit via an attaching unit come out of the control panel through a hole or notch of the rear wall portion of the control panel. In such a case, generally, the fan motor for cooling the heat sink is also disposed outside the control panel. The hole or notch of the rear wall portion is closed by the attaching unit of the motor drive device.

In most cases, since the control panel is provided adjacent to a wall of a building other machinery or the like, there is almost no space through which a person can pass at the rear side of the control panel. Therefore, it is difficult to get access to the fan motor from the rear side of the control panel to exchange and inspect the fan motor.

Thus, it has been proposed to form a second hole through which the fan motor can be passed in the rear wall portion of the control panel, together with the first hole that permits passage of the heat sink (for example, refer to Japanese Laid-open Patent Publication No. 2009-27776). According to this proposal, it is possible move the fan motor existing at the rear side of the control panel to the front side (front face) of the control panel through the second hole, thereby inspecting and exchanging the fan motor. Alternatively, it is sometimes the case that a hole through which the heat sink and the air blower can be passed together is formed in the rear wall portion of the control panel and an additional hole through which the air blower can be passed is formed in the attaching unit of the motor drive device.

Furthermore, in Japanese Patent No. 5312012 and Japanese Patent No. 3404907, a structure has been proposed in which for the purpose of maintenance of the device, a duct provided between an air blowing fan and a heat generating component is made attachable and removable.

Figure 6:
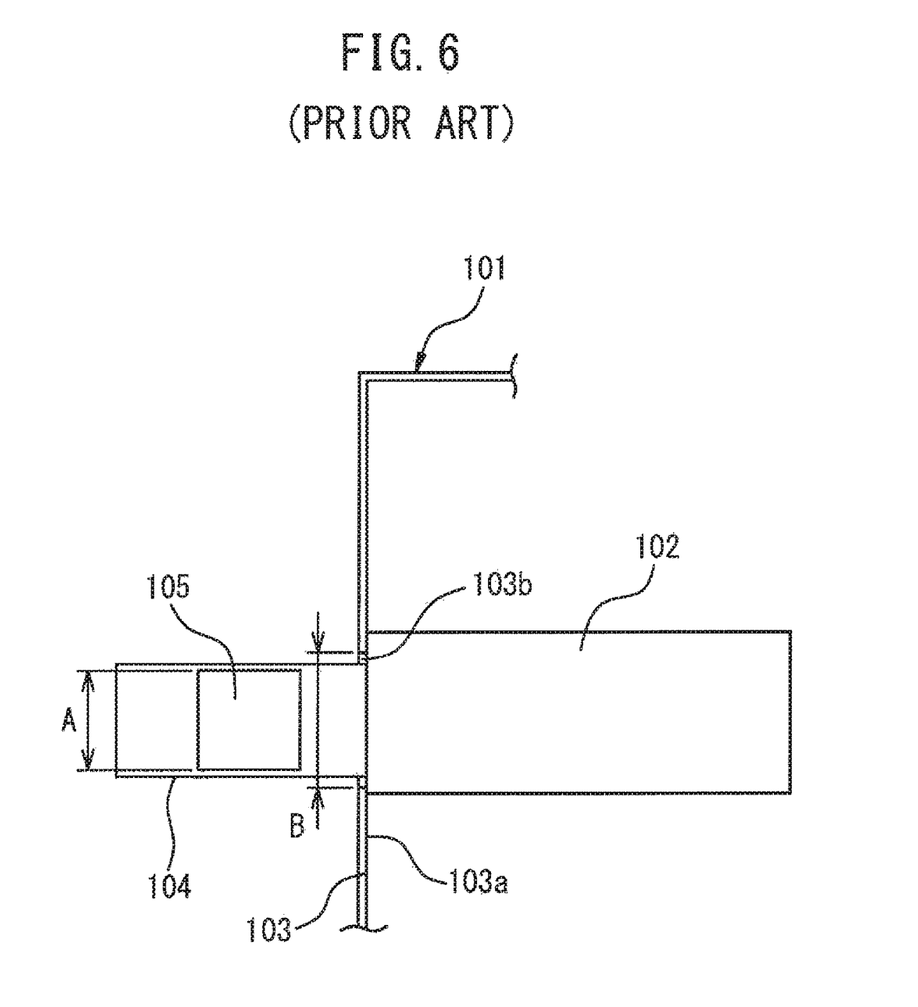
FIG. 6 is a top view schematically illustrating a major portion of a conventional motor drive device implemented in a control panel.

However, the above-described conventional technique has problems as follows. The problems of the conventional technique will now be described based on FIG. 6. FIG. 6 is a top view schematically illustrating a main portion of a conventional motor drive device which is implemented in a control panel.

According to FIG. 6, a motor control unit 102 of a motor drive device which is implemented in a control panel 101 is attached to a front face 103a of a rear wall portion 103 of the control panel 101. A hole or notch 103b is formed in the rear wall portion 103 of the control panel 101. A heat sink 104 attached to the motor control unit 102 is disposed outside the control panel 101 (particularly, at the rear side of the control panel 101) through the hole or notch 103b. A fan motor 105 is disposed on the upper end of the heat sink 104 disposed at the rear side of the control panel 101. With such a structure, in order to attach or remove the fan motor 105 from the front side (front face) of the control panel 101, it is required that the fan motor 105 be passed through the hole or notch 103b in the rear wall portion 103 of the control panel 101. Therefore, it is necessary to select, as the fan motor 105, a fan motor which is smaller than the notch 103b in the rear wall portion 103 of the control panel 101. In other words, as illustrated in FIG. 6, the size A of the fan motor 105 cannot be made larger than the size B of the notch 103b, so that usable fan motors are limited.

SUMMARY OF INVENTION

The present invention provides a motor drive device for which a fan motor having a large size can be selected while ensuring the cooling effect of a heat sink, and a control panel including the motor driving device.

According to a first aspect of the present invention, there is provided a motor drive device including:

a motor control unit disposed in a control panel;

an attaching unit provided at one side of the motor control unit and having a first surface directed toward the front of the control panel and a second surface opposite to the first surface;

a heat sink attached to the one side of the motor control unit or the second surface of the attaching unit and absorbing heat of the motor control unit;

a first duct disposed in opposing relationship to the second surface of the attaching unit;

a second duct disposed in opposing relationship to the first duct at a side opposite to a side of the attaching unit at which the first duct is disposed; and an air blower disposed in the second duct, wherein:

between the first duct and the second duct, there are formed a first opening that allows communication between outside of the first duct and inside of the second duct, and a second opening that allows communication between inside of the first duct and inside of the second duct;

the first duct is provided so as to connect the heat sink and the second opening with each other;

the second duct is provided so as to connect the first opening and the second opening with each other; and the air blower is disposed so as to generate an air flow from the first opening to the second opening or from the second opening to the first opening.

According to a second aspect of the present invention, there is provided the motor drive device according to the first aspect, wherein the second duct and the air blower are removably attached with respect to the first surface.

According to a third aspect of the present invention, there is provided the motor drive device according to the first or second aspect, wherein the air blower is removably attached with respect to the second duct.

According to a fourth aspect of the present invention, there is provided the motor drive device according to any one of the first to third aspects, wherein the first duct is removably attached with respect to the heat sink.

According to a fifth aspect of the present invention, there is provided the motor drive device according to any one of the first to fourth aspects, wherein the first duct is formed as a portion of the heat sink.

According to a sixth aspect of the present invention, there is provided the motor drive device according to any one of the first to fifth aspects, wherein the air blower is disposed in the second duct so as to blow air in a direction parallel to the first surface.

According to a seventh aspect of the present invention, there is provided the motor drive device according to any one of the first to fifth aspects, wherein the air blower is disposed in the second duct so as to blow air in a direction intersecting with the first surface, and an intake portion and an exhaust portion of the air blower are disposed in opposing relationship to the second opening.

According to an eighth aspect of the present invention, there is provided a control panel including the motor drive device according to any one of the first to seventh aspects, wherein:

a notch or hole that allows both the heat sink and the first duct to pass therethrough is formed in a rear wall portion of the control panel; and the attaching unit is fixed to the rear wall portion in the control panel, both the heat sink and the first duct are disposed outside the control panel through the notch or hole, and the first opening is in communication with a space outside the first duct through the notch or hole.

The objects, features, and advantages as well as other objects, features, and advantages of the present invention will become more clear from a detailed description of exemplary embodiments of the present invention illustrated in the accompanying drawings.

DETAILED DESCRIPTION

Embodiments of the present invention will next be described with reference to the drawings. In the following, like members are assigned like reference numerals throughout the drawings. To facilitate understanding, the scale of the drawings is changed appropriately. Further, the forms illustrated in the drawings are by way of example for practicing the present invention, and the present invention is not limited to the illustrated forms.

First Embodiment

Figure 1:
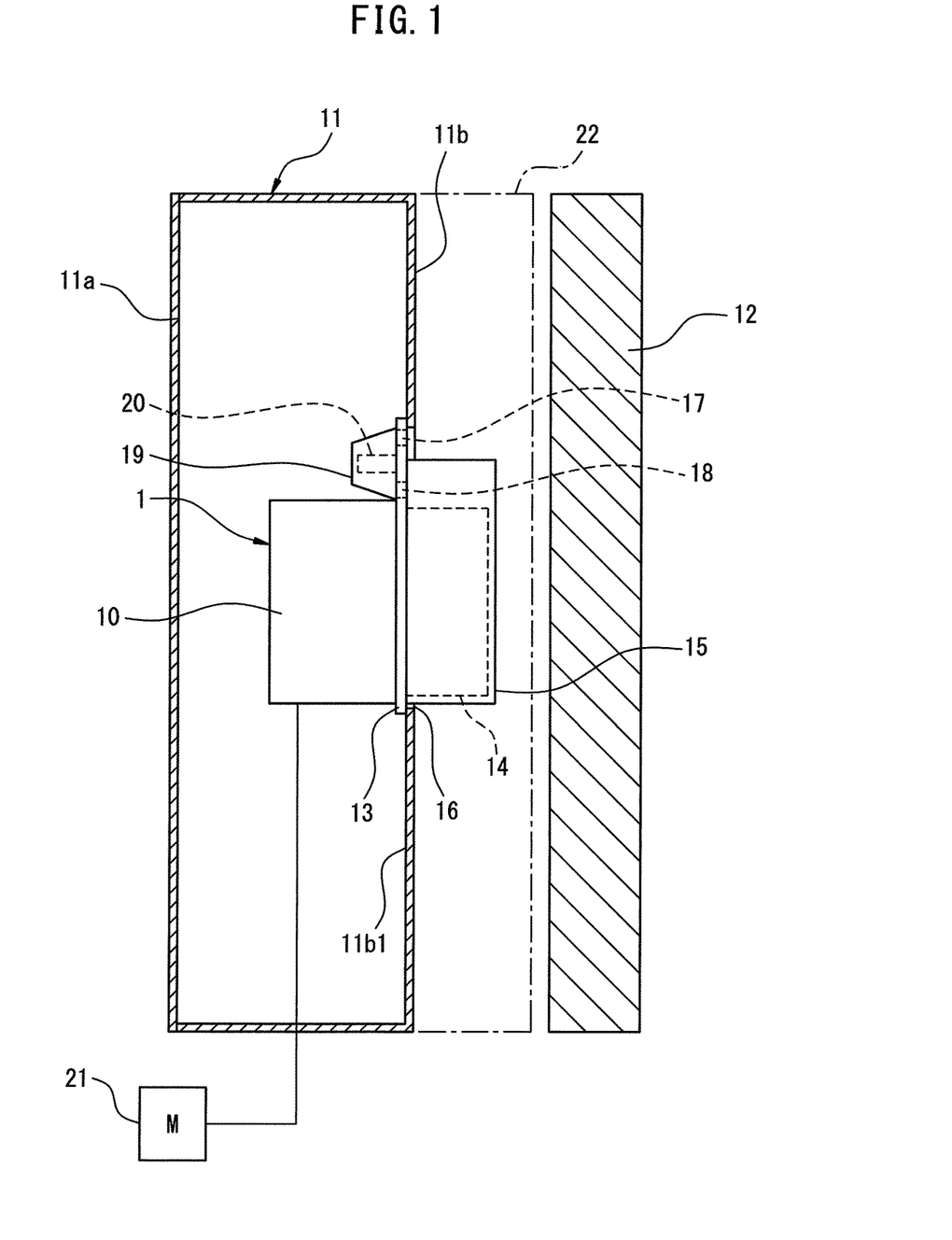
FIG. 1 is a simplified side sectional view of a control panel in which a motor drive device of a first embodiment is implemented.
Figure 2:
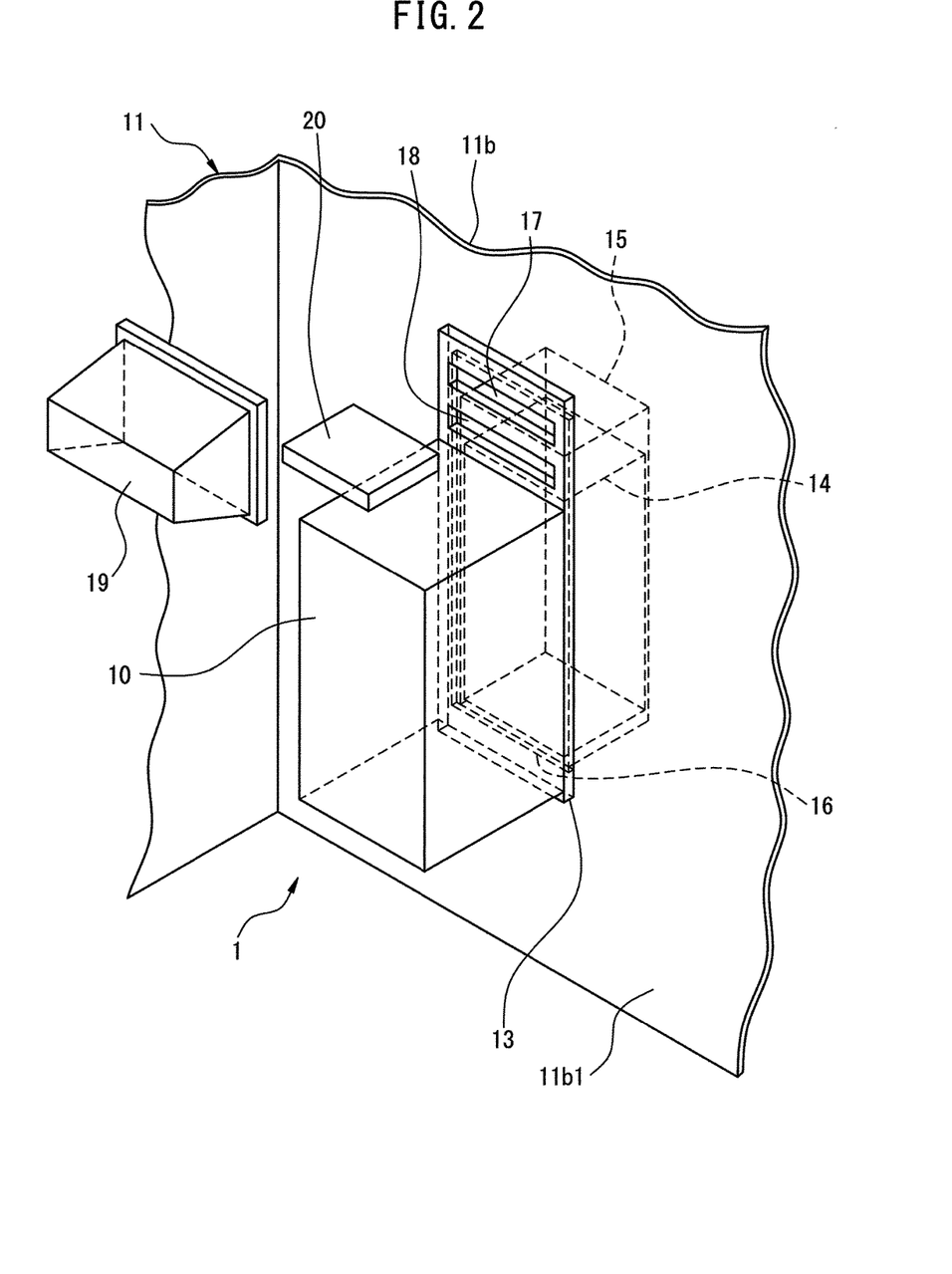
FIG. 2 is an enlarged perspective view illustrating the motor drive device illustrated in FIG. 1, together with a portion of a rear wall portion of the control panel.

FIG. 1 is a simplified side sectional view of a control panel in which a motor drive device of a first embodiment is implemented. FIG. 2 is an enlarged perspective view illustrating the motor drive device illustrated in FIG. 1, together with a portion of a rear wall portion of the control panel. However, in FIG. 2, there is illustrated a state in which a fan motor and a second duct illustrated in FIG. 1 are removed from a motor control unit of the motor drive device.

As illustrated in FIG. 1, the control panel 11 in which the motor drive device 1 is implemented is installed adjacent to a wall 12 of a building or other machinery. The control panel 11 is, for example, a heavy electrical control panel of an NC machine tool, and the motor drive device 1 includes, for example, a motor control unit 10 for controlling a servo motor 21, a heat sink 14 for cooling the control unit 10, and an air blower 20.

A housing of the control panel 11 of the present embodiment includes a front wall portion 11a and a rear wall portion 11b which are disposed in parallel to each other as illustrated in FIG. 1. The rear wall portion 11b is disposed in opposing relationship to a wall 12 of a building. Furthermore, the front wall portion 11a is composed of a door provided with a transparent window for enabling an operator of the control panel 11 to view and operate the motor drive device 1 and meters and switches (not illustrated) in the control panel 11.

Further, on one side of the motor control unit 10 of the motor drive device 1, there is provided a plate-like attaching unit 13 for attaching the motor control unit 10 to a front surface 11b1 of the rear wall portion 11b of the control panel 11. The attaching unit 13 has a first surface directed toward the front of the control panel 11 and a second surface opposite to the first surface. To the second surface of the attaching unit 13, there are attached the heat sink 14 and a first duct 15. The first duct 15 is formed as a portion of the heat sink 14. Furthermore, preferably, the heat sink 14 is shaped approximately corresponding to one side of the motor control unit 10 for the purpose of cooling the motor control unit 10. Further, the heat sink 14 is preferably formed of metal superior in thermal conductivity, such as aluminum, copper or the like.

The heat sink 14, although illustrated in simplified form in FIG. 1, includes, for example, a plurality of cooling fins, which are rectangular extending vertically and disposed with predetermined intervals. Needless to say, the heat sink 14 is not limited to the one including such cooling fins, but may be of any structure that provides an effect allowing heat to escape from the motor control unit 10 to outside. For example, the heat sink 14 may be configured by forming a plurality of cylindrical or conical protrusions on a surface of a metal block.

Further, as can be seen from FIGS. 1 and 2, a notch or hole 16 is formed in the rear wall portion 11b of the control panel 11. Although the motor control unit 10 is disposed in the control panel 11, the heat sink 14 and the first duct 15, which are attached to the attaching unit 13 of the motor control unit 10, are disposed outside the control panel 11 (particularly at the rear side of the control panel 11) through the notch or hole 16. Therefore, the notch or hole 16 of the rear wall portion 11b is formed more largely than the first duct 15 which is a portion of the heat sink 14. Further, the attaching unit 13 is formed one size larger than the notch or hole 16. By thus defining the respective sizes of the attaching unit 13 and the notch or hole 16, it is possible to cause the attaching unit 13 of the motor control unit 10 abutted against and fixed to the front surface 11b1 of the rear wall portions 11b of the control panel 11, with only the heat sink 14 being disposed outside the control panel 11.

Thus, when it is desired to clean the heat sink 14 and the first duct 15, it is possible for a cleaning worker to access the attaching unit 13 from the front side of the control panel 11 and attach and remove the heat sink 14 and the first duct 15, together with the attaching unit 13.

Further, as illustrated in FIG. 2, a portion of the mounting unit 13 above the motor control unit 10 is formed with a first opening 17 and a second opening 18 which each penetrate from the first surface to the second surface of the attaching unit 13. The openings 17 and 18 are located with a predetermined vertical interval. Further, the first opening 17 is communication with a space external of the first duct 15 through the notch or hole 16 formed in the rear wall portion 11b of the control panel 11. Furthermore, the second opening 18 is in communication with a space above the heat sink 14 in the first duct 15. Although the illustrated first duct 15 covers the whole of the heat sink 14 except for the lower end of the heat sink 14, there is no limitation to such a shape. In the present invention, the first duct 15 is preferred to have at least a shape for connecting the second opening 18 in the second surface of the attaching unit 13 and one end of the heat sink 14 existing adjacent to the second opening 18.

Referring again to FIG. 1, a second duct 19 is removably attached to the first surface of the attaching unit 13 with unillustrated bolts. In other words, the second duct 19 is attachable and removable with respect to the attaching unit 13 fixed to the front surface 11b1 of the rear wall portion 11b of the control panel 11. Further, in the second duct 19, there is provided a fan motor 20 that serves as the air blower.

With such a configuration, as illustrated in FIG. 2, it is possible to attach and remove the second duct 19 and the fan motor 20 from the front side of the control panel 11 when exchanging and inspecting the fan motor 20. Further, it is possible to freely select the size of the fan motor 20 since there is no need to pass the fan motor 20 through the hole or notch formed in the rear wall portion 11b of the control panel 11 or the attaching unit 13 of the motor control unit 10.

Furthermore, with regard to the attachment of the fan motor 20, a method is conceivable of removably fixing the fan motor 20 to the attaching unit 13 and fixing the second duct 19 to the attaching unit 13 so as to cover the fixed fan motor 20. Alternatively, a method is conceivable of removably fixing the fan motor 20 in the second duct 19 and attaching the second duct 19, in which the fan motor 20 is fixed, to the attaching unit 13. By the latter method, the fan motor 20 can be removed along with the second duct 19, so that work can be reduced more than by the former method. Furthermore, in the present embodiment, the fan motor 20 is disposed in the second duct 19 so as to blow air in a direction parallel to the first surface of the attaching unit 13. In this instance, the fan motor 20 is disposed intermediate between the first opening 17 and the second opening 18.

Further, in the present invention, as illustrated in FIG. 1, the second duct 19 is formed so as to cover both the first opening 17 and the second opening 18. In this manner, the inside space of the second duct 19 is in communication with the both the first opening 17 and the second opening 18. Furthermore, the inside space of the first duct 15, which is located opposite to the second duct 19 with the attaching unit 13 held therebetween, is only in communication with the second opening 18. With such a configuration, the air in the first duct 15 existing outside the control panel 11 is allowed to flow from the second opening 18 of the attaching unit 13 through the inside space of the second duct 19 existing in the control panel 11 and from the first opening 17 of the attaching unit 13 to outside of the first duct 15. Furthermore, the air outside the first duct 15 existing outside the control panel 11 is allowed to flow from the first opening 17 of the attaching unit 13 through the inside space of the second duct 19 existing in the control panel 11 and from the second opening 18 of the attaching unit 13 into the first duct 15 existing outside the control panel 11. By generating such air flows by the fan motor 20 in the second duct 19, it is possible to cool the heat sink 14 in the first duct 15.

Thus, in the present invention, it is possible to cool the heat sink 14 regardless of the fan motor 20 not being disposed adjacent to the heat sink 14.

Figure 3:
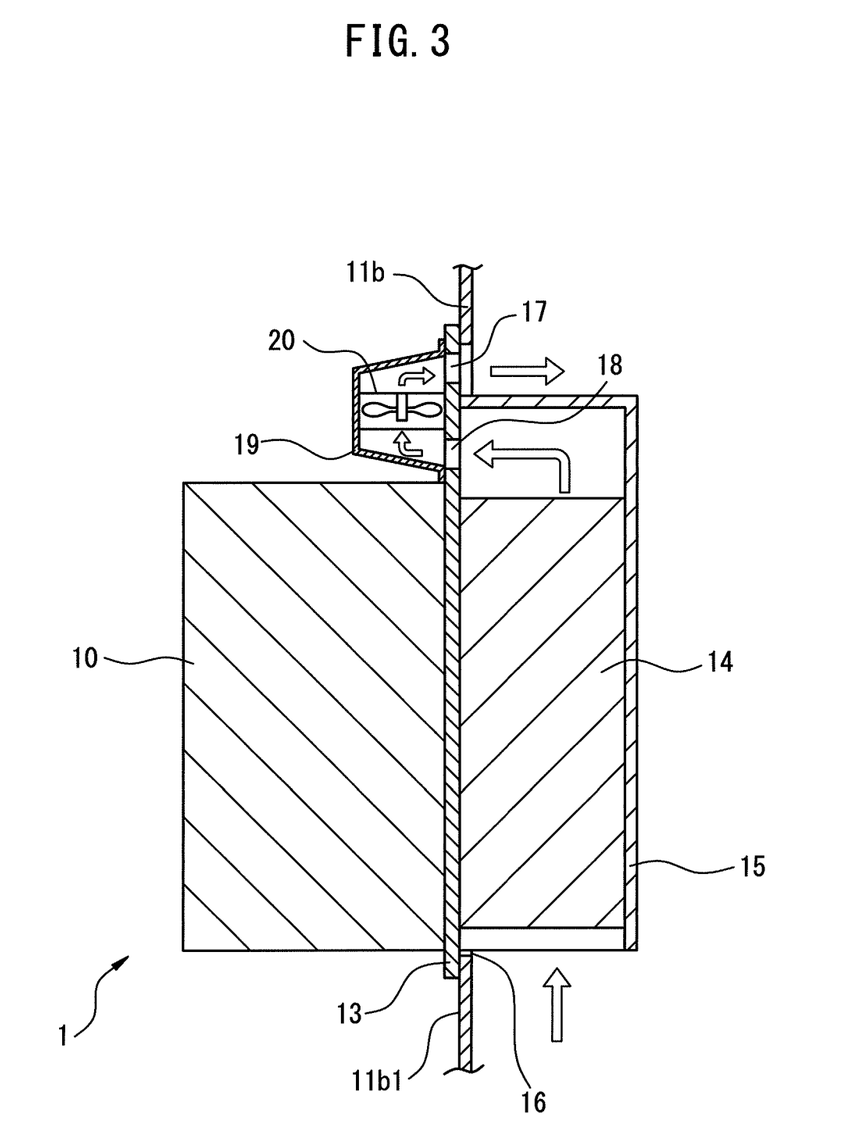
FIG. 3 is a longitudinal sectional view schematically illustrating the motor drive device of the first embodiment.

Referring to FIG. 3, description will be made of the operation for cooling the motor control unit 10 of the motor drive device 1. FIG. 3 is a longitudinal sectional view schematically illustrating the motor drive device 1 of the first embodiment. However, in order to facilitate understanding of FIG. 3, the section of the motor control unit 10 is illustrated simplified as a flat section.

When the fan motor 20 is driven, an air flow such as indicated by arrows in FIG. 3 occurs. Specifically, the fan motor 20 is disposed so as to generate an upward wind in the second duct 19. When the wind is sent from a space below the fan motor 20 in the second duct 19 toward a space thereabove, the air in the vicinity of the lower end of the first duct 15 flows through the heat sink 14 to a space above the heat sink 14 in the first duct 15. Then, the heat sink 14, which has absorbed the heat of the motor control unit 10, is cooled. The air flowing in the space above the heat sink 14 in the first duct 15 enters from the second opening 18 into the second duct 19 and is sent upwardly by the fan motor 20. Further, the air sent to the space above the fan motor 20 in the second duct 19 is exhausted to outside the control panel 11 through the first opening 17.

Figure 4:
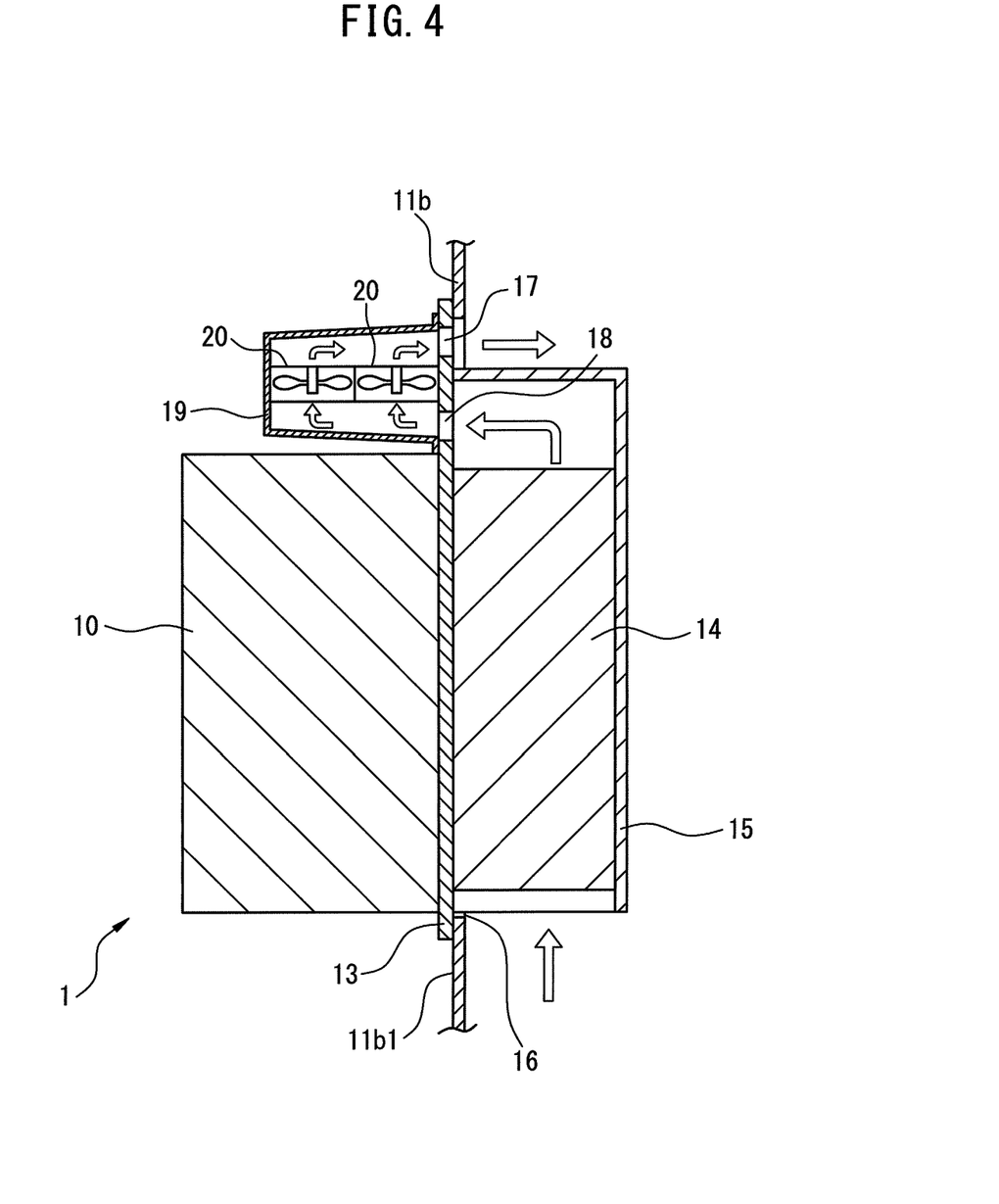
FIG. 4 is a longitudinal sectional view schematically illustrating a modification to the motor drive device of the first embodiment.

FIG. 4 is a longitudinal sectional view schematically illustrating a modification to the motor drive device 1 of the first embodiment described above. However, in order to facilitate understanding of FIG. 4, the section of the motor control unit 10 is illustrated simplified as a flat section.

In the first embodiment illustrated in FIGS. 1 through 3, the single fan motor 20 is provided in the second duct 19. However, the number of the fan motor 20 is not limited to single, and the configuration of the motor drive device 1 may be modified as illustrated in FIG. 4. For example, as illustrated in FIG. 4, it may be configured such that two fan motors 20 are provided in the second duct 19 and each fan motor 20 generates an upward wind in the second duct 19. Needless to say, the number of the fan motors 20 may be three or more. The shape of the second duct 19 may be changed depending on the number of the fan motors 20. However, preferably the second duct 19 is formed so as to guide the wind from the first opening 17, through the fan motor 20, to the second opening 18 or from the second opening 18, through the fan motor 20, to the first opening 17.

By increasing the number of the fan motors 20 as in the modification illustrated in FIG. 4, it is possible to enhance the cooling effect of the heat sink 14 with respect to the motor control unit 10.

Note that, although in each of the views of FIGS. 3 and 4, a state is illustrated in which the fan motor 20 generates an upward wind in the second duct 19, the fan motor 20 may be driven to generate a downward wind in the second duct 19. In such a case, the flow of the wind cooling the heat sink 14 is directed opposite to the direction indicated by the arrows in FIGS. 3 and 4.

Further, while, in the first embodiment, the two openings 17 and 18 are located with a predetermined spacing in a vertical direction as illustrated in FIG. 2, in the present invention, the openings 17 and 18 may be located with a predetermined spacing in a horizontal direction. In such a case, the flow of the air in the second duct 19 is a horizontal flow in the second duct 19.

Second Embodiment

Description will next be made of a second embodiment. However, components the same as those of the first embodiment are denoted by the same reference numerals, and description thereof is omitted. Accordingly, only the differences with respect to the components of the first embodiment are described.

Figure 5:
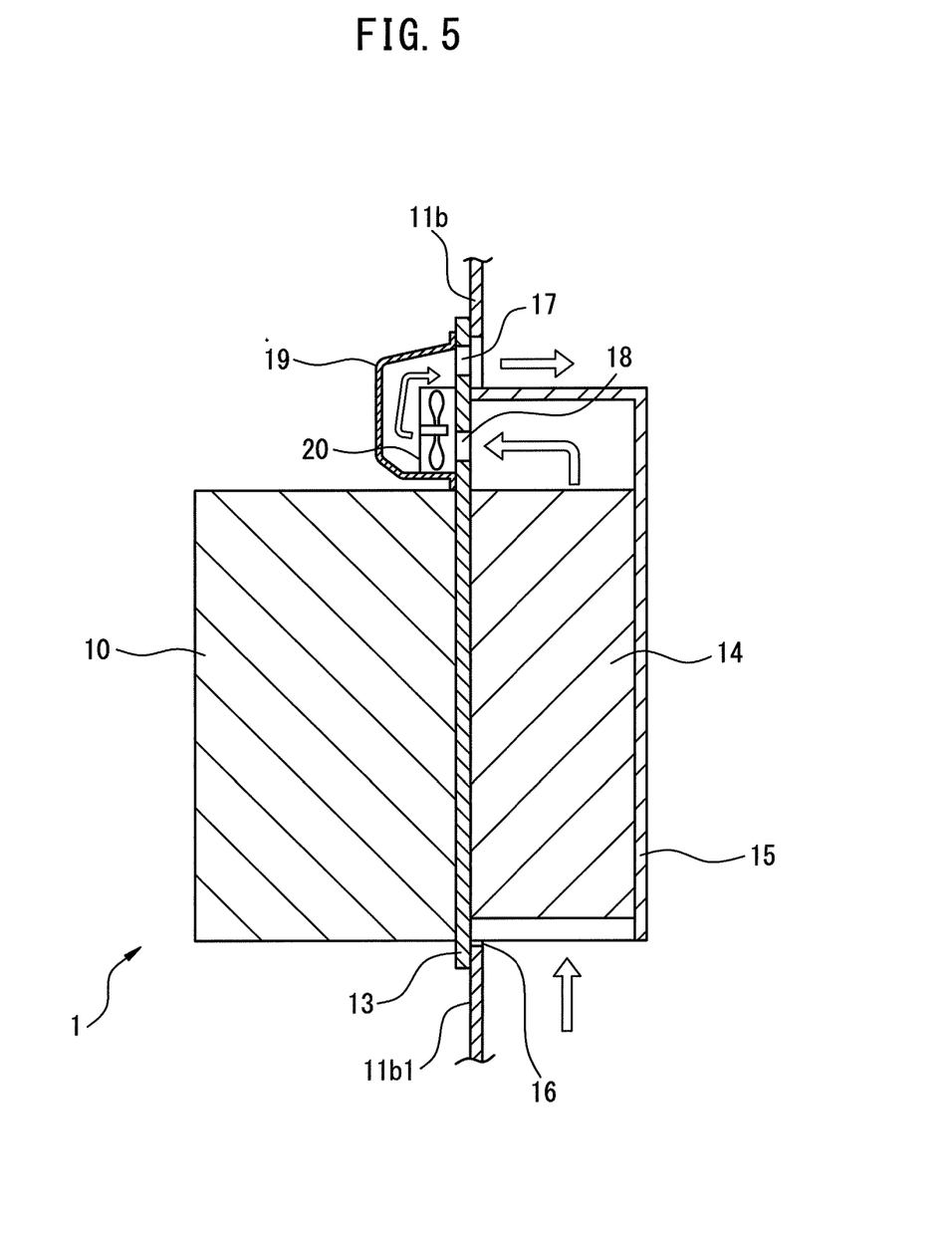
FIG. 5 is a longitudinal sectional view schematically illustrating a motor drive device of a second embodiment.

FIG. 5 is a longitudinal sectional view schematically illustrating the motor drive device of the second embodiment. However, in order to facilitate understanding of FIG. 5, the section of the motor control unit 10 is illustrated simplified as a horizontal section.

In the first embodiment described above, the fan motor 20 is disposed to blow air upward or downward in the second duct 19. In contrast, in the second embodiment, as illustrated in FIG. 5, the fan motor 20 is disposed in the second duct 19 so as to blow air in a direction intersecting the first surface of the attaching unit 13.

Further, the fan motor 20 is disposed in the second duct 19 such that an intake portion or an exhaust portion of the fan motor 20 is opposite to the second opening 18. Preferably, the second duct 19 is formed so as to guide the wind blown out from the fan motor 20 to the first opening 17. The other configuration is the same as the first embodiment described above (refer to FIGS. 1 through 4).

In the case of the second embodiment, when the fan motor 20 is driven, an air flow such as indicated by arrows in FIG. 5 is generated. Specifically, the fan motor 20 is disposed in the second duct 19 so as to blow air in a direction intersecting the first surface of the attaching unit 13, particularly in a direction away from the second opening 18 of the attaching unit 13 (from right to left as viewed in FIG. 5). As air is sent from the second opening 18 to which the fan motor 20 is opposite toward a space leftward of the fan motor 20 in the second duct 19, the air in the vicinity of the lower end of the first duct 15 is allowed to flow through the heat sink 14 to a space above the heat sink 14 in the first duct 15. Then, the heat sink 14, which has absorbed heat from the motor control unit 10, is cooled. The air which has flown to the space above the heat sink 14 in the first duct 15 is blown by the fan motor 20 through the second opening 18 against the inner wall surface of the second duct 19. In this manner, the blown air is sent along the inner wall surface of the second duct 19 to the first opening 17 and exhausted to outside of the control panel 11 through the first opening 17.

Note that, although in FIG. 5, a state illustrated in which the fan motor 20 generates a wind in a direction away from the second opening 18 of the attaching unit 13 (from right to left as viewed in FIG. 5), the fan motor 20 may be driven so as to generate a wind in a direction approaching the second opening 18 of the attaching unit 13 (from left to right as viewed in FIG. 5). In such a case, the air flow that cools the heat sink 14 is directed opposite to the direction indicated by the arrows in FIG. 5.

Further, although in FIG. 5, a state is illustrated in which an intake portion or an exhaust portion of the fan motor 20 is disposed opposite to the second opening 18, in the present invention, the intake portion or the exhaust portion of the fan motor 20 may be disposed opposite to the first opening 17.

Further, in the second embodiment as well, it is possible to cool the heat sink 14 outside the control panel 11 by the fan motor 20 disposed in the control panel 11 using the first duct 15 and the second duct 19 as in the first embodiment described above. In this manner, it is possible to attach and remove the second duct 19 and the fan motor 20 from the front side of the control panel 11 when exchanging and inspecting the fan motor 20. Further, it is possible to freely select the size of the fan motor 20 since there is no need to pass the fan motor 20 through the hole or notch formed in the rear wall portion 11b of the control panel 11 or the attaching unit 13 of the motor control unit 10.

Other Embodiments

Note that, although in the first and second embodiments exemplified above, the second duct 19 and the fan motor 20 are disposed above the motor control unit 10, the present invention is not limited to such a configuration. In other words, a structure may be possible in which the second duct 19 and the fan motor 20 are disposed below the motor control unit 10 so that the wind is sent from below the heat sink 14 to thereabove or sent from above the heat sink 14 to therebelow.

Further preferably, unillustrated cooling fins or protrusions that constitute the heat sink 14 are formed such that air is allowed to pass therethrough in a vertical direction. Moreover, assembly is facilitated by integrating the first duct 15 and the heat sink 14 with each other beforehand. The heat sink 14 may be attached to the second surface of the attaching unit 13 or may be structured integral with the attaching unit 13.

Further, in each of the embodiments described above, the motor control unit 10 is mounted in the control panel 11 by fixing the attaching unit 13 provided on one side of the motor control unit 10 to the front surface 11b1 of the rear wall portion 11b of the control panel 11. Such attaching unit 13 is prepared as an attachment separable from the motor control unit 10 as illustrated in FIGS. 2 and 3, and the motor control unit 10 is mounted in the control panel 11 using the attachment. However, in the present invention, the attaching unit 13 may be one that is composed of a portion of the motor control unit 10, such, for example, as a flange. In this instance, the heat sink 14 is attached directly to one side of the motor control unit 10.

Further, in each of the embodiments described above, as illustrated in FIGS. 3-5, the second duct 19 is attached to the attaching unit 13 in a manner to cover both the first opening 17 and the second opening 18. Thus, the space inside the second duct 19 is tightly closed in the control panel 11. Therefore, even when outside air outside the control panel 11 which contains dust, cutting oil or the like around a machine tool, for example, is introduced from outside of the control panel 11 into the second duct 19 through the first opening 17 or the second opening 18, an effect is provided that such dirty outside air is prevented from being introduced into the control panel 11. In order to enhance this effect, it is preferable to ensure air tightness in the second duct 19 by interposing a seal member between the second duct 19 and the attaching unit 13. In addition, a wall panel 22 such as indicated by a dot-dash-line in FIG. 1 may be attached to the outside surface of the control panel 11, thereby reducing the possibility that dirty outside air is introduced into the control panel 11.

Further, in each of the embodiments described above, as illustrated in FIGS. 2 and 3, the first opening 17 and the second opening 18 are formed through the attaching unit 13. However, the first opening 17 may be formed as a communication port that provides, between the first duct 15 and the second duct 19, communication outside of the first duct 15 and inside of the second duct 19. Furthermore, the second opening 18 may be formed as a communication port that provides, between the first duct 15 and the second duct 19, communication between inside of the first duct 15 and inside of the second duct 19. Therefore, for example, the first opening 17 and the second opening 18 are formed in the second duct 19, or alternatively the first opening 17 is formed in the second duct 19, while the second opening 18 is formed in the first duct 15. The present invention also encompasses an aspect in which the attaching unit 13 is formed with a single through hole, such as one which includes both such openings 17 and 18 inside thereof.

Further, while in each of the embodiments described above, as illustrated in FIGS. 2 and 3, the first duct 15 and the second duct 19 are attached to the attaching unit 13, the present invention also encompasses an aspect in which the first duct 15 and the second duct 19 are connected without interposing the attaching unit 13 between the first duct 15 and the second duct 19. In the aspect in which the first duct 15 and the second duct 19 are connected in such a manner, for example, the second opening 18 is formed directly in the rear wall portion 11b of the control panel apart from the hole 16 which permits the heat sink 14 to pass therethrough, such as illustrated in FIG. 2. The first duct 15 and the second duct 19 each are attached directly to the rear wall portion 11b of the control panel. Thus, between the first duct 15 and the second duct 19, there may be formed the first opening 17 which allows communication between outside the first duct 15 and inside the second duct 19 and the second opening 18 which allows communication between inside the first duct 15 and inside the second duct 19.

Note that, although in the foregoing, exemplary embodiments have been illustrated, the present invention is not limited to the respective embodiments described above, and the respective embodiments described above can be changed to various shapes, structures, materials or the like within a scope that does not depart from the idea of the present invention.

Advantage According to Each Embodiment of the Present Invention

According to the first aspect and the eighth aspect of the present invention, the first surface of the attaching unit provided in the motor drive device is a surface is directed toward the front of the control panel, and on the first surface, there is provided the second duct in which the air blower, e.g., the fan motor is provided. Hence, in the state in which the motor control unit is mounted in the control panel using the attaching unit, both the second duct and the air blower are disposed in the control panel. Further, between the first duct and the second duct, there are formed the first opening that permits of communication between outside the first duct and inside the second duct, and the second opening that permits of communication between inside the first duct and inside the second duct. Thus, when the air blower in the second duct is driven, an air flow occurs from the first opening to the second opening or from the second opening to the first opening. Thereupon, an air flow occurs also in the first duct connecting the second opening and the heat sink, and thus wind hits the heat sink whereby the heat sink is cooled. In other words, in the present invention, it is possible to enhance the cooling effect of the heat sink without disposing the air blower adjacent to the heat sink. Therefore, even with a configuration in which the heat sink is disposed outside the control panel, there is no need to pass the air blower through the hole, notch or the like formed in the rear wall portion of the control panel as in the conventional technique. Consequently, it is possible to freely select the size of the air blower.

Further, according to the second aspect of the present invention, when exchanging and inspecting the air blower, it is possible to attach and remove the second duct and the air blower from the front side of the control panel.

According to the third aspect of the present invention, the air blower is attachable and removable with respect to the second duct, so that the air blower and the second duct can be attached to the first surface of the attaching unit in unison and in combination.

According to the fourth aspect of the present invention, the first duct is attachable and removable with respect to the heat sink, so that the heat sink and the first duct can be attached to the second surface of the attaching unit in unison and in combination.

According to the fifth aspect of the present invention, the first duct is formed as a portion of the heat sink, so that the heat sink can be effectively cooled by wind passing through the first duct.

According to the sixth aspect and the seventh aspect of the present invention, the air blower can generate, in the second duct, an air flow from the first opening to the second opening formed in the attaching unit or vice versa.

What is claimed is:

1. A motor drive device comprising:
   a motor control unit disposed in a control panel;
   an attaching unit provided on one side of the motor control unit and having first surface directed toward a front of the control panel and a second surface opposite to the first surface;
   a heat sink attached to the one side of the motor control unit or the second surface of the attaching unit to absorb heat of the motor control unit;
   a first duct disposed in opposing relationship to the second surface of the attaching unit;
   a second duct disposed at a side opposite to a side of the attaching unit at which the first duct is disposed and in opposing relationship to the first duct; and
   an air blower disposed in the second duct,
   wherein:
   between the first duct and the second duct, there are formed a first opening that allows communication between outside of the first duct and inside of the second duct, and a second opening that allows communication between inside of the first duct and inside of the second duct;
   the first duct is provided so as to connect the heat sink and the second opening with each other;
   the second duct is provided so as to connect the first opening and the second opening with each other; and
   the air blower is disposed so as to generate an air flow from the first opening to the second opening or from the second opening to the first opening.

2. The motor drive device according to claim 1, wherein the second duct and the air blower are removably attached with respect to the first surface.

3. The motor drive device according to claim 1, wherein the air blower is removably attached with respect to the second duct.

4. The motor drive device according to claim 1, wherein the first duct is removably attached with respect to the heat sink.

5. The motor drive device according to claim 1, wherein the first duct is formed as a portion of the heat sink.

6. The motor drive device according to claim 1, wherein the air blower is disposed in the second duct so as to blow air in a direction parallel to the first surface.

7. The motor drive device according to claim 1, wherein the air blower is disposed in the second duct so as to blow air in a direction intersecting with the first surface, and an intake portion and an exhaust portion of the air blower are disposed in opposing relationship to the second opening.

8. A control panel including the motor drive device according to claim 1, wherein:
   a notch or hole that allows both the heat sink and the first duct to pass therethrough is formed in a rear wall portion of the control panel; and
   the second surface of the attaching unit is fixed to the rear wall portion in the control panel, both the heat sink and the first duct are disposed outside the control panel through the notch or hole, and the first opening is in communication with a space outside the first duct through the notch or hole.

* * * * *